United States Patent
Tong et al.

(10) Patent No.: US 10,892,526 B2
(45) Date of Patent: Jan. 12, 2021

(54) STRIPLINE DETECTOR FOR IN SITU BATTERY NMR

(71) Applicant: Georgetown University, Washington, DC (US)

(72) Inventors: YuYe J. Tong, Gaithersburg, MD (US); Eric G. Sorte, Washington, DC (US)

(73) Assignee: GEORGETOWN UNIVERSITY, Washington, DC (US)

(*) Notice: Subject to any disclaimer, the term of this patent is extended or adjusted under 35 U.S.C. 154(b) by 249 days.

(21) Appl. No.: 15/682,075

(22) Filed: Aug. 21, 2017

(65) Prior Publication Data

US 2018/0053973 A1 Feb. 22, 2018

Related U.S. Application Data

(60) Provisional application No. 62/377,906, filed on Aug. 22, 2016.

(51) Int. Cl.
| | |
|---|---|
| *H01M 10/0525* | (2010.01) |
| *H01M 10/48* | (2006.01) |
| *H01M 4/58* | (2010.01) |
| *H01M 4/587* | (2010.01) |
| *H01M 4/66* | (2006.01) |
| *H01M 2/16* | (2006.01) |
| *G01N 24/08* | (2006.01) |

(Continued)

(52) U.S. Cl.
CPC .......... *H01M 10/48* (2013.01); *G01N 24/088* (2013.01); *G01R 33/3456* (2013.01); *G01R 33/3628* (2013.01); *G01R 33/46* (2013.01); *H01M 2/1653* (2013.01); *H01M 4/587* (2013.01); *H01M 4/5825* (2013.01); *H01M 4/661* (2013.01); *H01M 8/04305* (2013.01); *H01M 10/0525* (2013.01)

(58) Field of Classification Search
CPC .... H01M 10/48; H01M 10/0525; H01M 2/16; H01M 4/58; H01M 4/587; H01M 4/66; H01M 8/04305; H01M 10/28; H01M 4/661; H01M 2/1653; H01M 4/5825; G01N 24/08; G01N 24/088; G01R 33/46; G01R 33/3456; G01R 33/3628
See application file for complete search history.

(56) References Cited

U.S. PATENT DOCUMENTS

| | | | |
|---|---|---|---|
| 2008/0290869 A1 | 11/2008 | Hutton et al. | |
| 2011/0104527 A1* | 5/2011 | Choi | H01M 2/0285 429/53 |
| 2015/0008917 A1 | 1/2015 | Kentgens et al. | |

FOREIGN PATENT DOCUMENTS

| | | | |
|---|---|---|---|
| JP | 2009181815 | * | 8/2009 |
| WO | WO 2013092996 A1 | * | 6/2013 |

OTHER PUBLICATIONS

JP 2009181815 MT (Year: 2009).*

(Continued)

*Primary Examiner* — Alexander Usyatinsky
(74) *Attorney, Agent, or Firm* — Lathrop GPM; Alan Steele

(57) ABSTRACT

Provided are batteries and fuel cells incorporating a stripline detector for use in nuclear magnetic resonance (NMR). The stripline batteries and fuel cells can be used for in situ NMR measurement of battery or fuel cell chemistry. Also provided are methods for measuring in situ battery and fuel cell NMR using the stripline batteries and fuel cells of the invention.

12 Claims, 4 Drawing Sheets

(51) Int. Cl.
*G01R 33/46* (2006.01)
*G01R 33/36* (2006.01)
*H01M 8/04298* (2016.01)
*G01R 33/345* (2006.01)

(56) References Cited

OTHER PUBLICATIONS

Bart et al. Anal. Chem.2017, 894, 2296-2303 (Year: 2017).*
Bart et. al., Anal. Chem.2017, 2296-2303 (Year: 2017).*
Bart et al. (2009) "A microfluidic high-resolution NMR flow probe," J. Am. Chem. Soc. 131(14):5014-5.
Bart et al. (2009) "Optimization of stripline-based microfluidic chips for high-resolution NMR," J. Magn. Reson. 201 (2):175-85.
Van Bentum et al. (2007) "Stripline probes for nuclear magnetic resonance," J. Magn. Reson. 189(1):104-13.

* cited by examiner

STRIPLINE DETECTOR FOR IN SITU BATTERY NMR

RELATED APPLICATION

This application claims the benefit of U.S. Provisional Patent Application Ser. No. 62/377,906, filed Aug. 22, 2016, the entire disclosure of which is hereby incorporated herein by reference.

STATEMENT REGARDING FEDERALLY SPONSORED RESEARCH OR DEVELOPMENT

This invention was made with government support under grant number FG02-07ER15895 awarded by the Department of Energy. The government has certain rights in the invention.

BACKGROUND

Nuclear magnetic resonance (NMR) is a well-established spectroscopic technique for the identification of chemical species and is broadly applied in many different fields like synthetic and supramolecular chemistry, catalysis, materials science, biology, and medicine. In a simple NMR experiment, the sample is exposed to a static magnetic field ($B_0$). After excitation of the nuclear spin system using a short radio frequency (rf) pulse, the processing magnetization is detected. The recorded resonance frequencies (peaks in the NMR spectra) are a probe of the local electronic environment of a specific nucleus in a molecule. Additionally, fine structure like J-couplings and dipolar couplings are a measure of chemical bonding and distance between two nuclei, respectively. NMR is a non-invasive technique and provides direct quantitative information.

NMR has been used to study batteries, albeit with limited success. In traditional battery NMR, the battery under investigation is placed inside a solenoid coil. The metal battery electrodes, essential to the battery operation, are necessarily also placed inside the coil, which lowers the sensitivity and resolution of the resulting data. In the case of electrodes that are thick compared to the rf skin depth at the NMR frequency, in situ NMR may actually be impossible. In that case, the rf field is effectively screened by the metal electrodes and is prevented from imparting the magnetic energy necessary for NMR to the interior of the battery.

Stripline detectors have been demonstrated in the past for limited NMR applications involving experiments where sample volumes are extremely limited. In such experiments, the stripline detector has the advantage of high theoretical signal-to-noise while minimizing the magnetic susceptibility challenges that plague traditional microcoil solenoid NMR. Van Bentum et al., *J Magn Reson* 189 (1): 104-13 (2007); Bart et al., *J Am Chem Soc* 131 (14): 5014-5 (2009); Bart et al., *J Magn Reson* 201 (2): 175-85 (2009); U.S. Patent Application Publication 2008/0290869 to Hutton et al.; and U.S. Patent Application Publication 2015/0008917 to Kentgens et al., the entire contents of which are incorporated herein by reference.

SUMMARY OF THE INVENTION

Provided are battery and fuel cell systems featuring an internal stripline detector. The essentially 2-dimensional stripline detector is built into the battery or fuel cell itself during fabrication, and allows high quality NMR data to be obtained in situ during battery or fuel cell operation regardless of the thickness of the electrodes. The device can be used to study any NMR active nucleus of interest and so is extremely versatile in studying a variety of battery and fuel cell types. This device thus has the potential to allow investigation of many poorly understood battery and fuel cell chemistries, and provides the means to monitor the creation and consumption of chemical species during actual battery or fuel cell operation conditions.

An aspect of the invention is a battery comprising a stripline detector.

In certain embodiments, the battery further comprises metallic cathode and anode support plates arranged in substantially parallel planes and situated on opposite sides of the stripline detector.

In certain embodiments, the metallic cathode support plate comprises aluminum.

In certain embodiments, the metallic cathode support plate further comprises a cathode material deposited on the cathode support plate.

In certain embodiments, the cathode material deposited on the cathode support plate is selected from the group consisting of lithium iron phosphate ($LiFePO_4$), lithium cobalt oxide ($LiCoO_2$), and spinel cathode materials.

In certain embodiments, the metallic anode support plate comprises copper.

In certain embodiments, the metallic anode support plate further comprises an anode material deposited on the anode support plate.

In certain embodiments, the anode material deposited on the anode support plate is graphite.

In certain embodiments, the battery further comprises a first nonconductive separator situated between the stripline detector and the metallic cathode support plate, and a second nonconductive separator situated between the stripline detector and the metallic anode support plate, wherein the first nonconductive separator electrically isolates the stripline detector from the cathode, and the second nonconductive separator electrically isolates the stripline detector from the anode.

In certain embodiments, the first nonconductive separator and the second nonconductive separator independently comprise a material selected from the group consisting of polyethylene, polypropylene, and polytetrafluoroethylene (PTFE).

In certain embodiments, the first nonconductive separator and the second nonconductive separator are the same.

In certain embodiments, the first nonconductive separator and the second nonconductive separator are a single nonconductive separator.

An aspect of the invention is a fuel cell comprising a stripline detector.

In certain embodiments, the fuel cell further comprises metallic cathode and anode support plates arranged in substantially parallel planes and situated on opposite sides of the stripline detector.

In certain embodiments, the metallic cathode support plate comprises aluminum.

In certain embodiments, the metallic cathode support plate further comprises a cathode material deposited on the cathode support plate.

In certain embodiments, the cathode material deposited on the cathode support plate is selected from the group consisting of lithium iron phosphate ($LiFePO_4$), lithium cobalt oxide ($LiCoO_2$), and spinel cathode materials.

In certain embodiments, the metallic anode support plate comprises copper.

In certain embodiments, the metallic anode support plate further comprises an anode material deposited on the anode support plate.

In certain embodiments, the anode material deposited on the anode support plate is graphite.

In certain embodiments, the fuel cell further comprises a first nonconductive separator situated between the stripline detector and the metallic cathode support plate, and a second nonconductive separator situated between the stripline detector and the metallic anode support plate, wherein the first nonconductive separator electrically isolates the stripline detector from the cathode, and the second nonconductive separator electrically isolates the stripline detector from the anode.

In certain embodiments, the first nonconductive separator and the second nonconductive separator independently comprise a material selected from the group consisting of polyethylene, polypropylene, and polytetrafluoroethylene (PTFE).

In certain embodiments, the first nonconductive separator and the second nonconductive separator are the same.

In certain embodiments, the first nonconductive separator and the second nonconductive separator are a single nonconductive separator.

An aspect of the invention is a method for measuring in situ battery nuclear magnetic resonance (NMR), comprising
  providing a stripline battery of the invention;
  connecting the stripline detector to an NMR circuit;
  isolating electrode leads of the battery from alternating current NMR circuitry; and
  cycling the battery while acquiring NMR data from the battery.

An aspect of the invention is a method for measuring in situ fuel cell nuclear magnetic resonance (NMR), comprising
  providing a stripline fuel cell of the invention;
  connecting the stripline detector to an NMR circuit;
  isolating electrode leads of the battery from alternating current NMR circuitry; and
  cycling the fuel cell while acquiring NMR data from the fuel cell.

DETAILED DESCRIPTION

A stripline detector is a thin strip of metal or wire. For use in NMR, the metallic strip or wire is confined between two metal shielding plates. To obtain a high rf-field strength, which is necessary for high sensitivity, the strip is constricted in an hourglass shape. In the narrowed (neck) area of the constriction, the current density increases locally, and with that the rf-field strength. Alternatively, in the case of a wire, the current density likewise increases locally, and with that the rf-field strength.

Figure 1A:
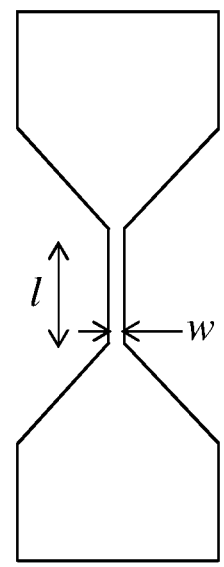
FIG. 1A is a schematic drawing depicting a front view of stripline detector geometry. The narrow neck is of length l and of width w.

In an embodiment, the solenoid detector itself consists of a thin metallic strip cut into an hourglass shape (see FIG. 1A). The constriction in the center marks the sensitive region of the detector where the narrowed body provides for high current densities. Current flowing through the neck of the stripline produces a circulating magnetic field that circles the stripline much like the magnetic field produced by current flowing in a wire. This magnetic field strength decreases as 1/r, where r is the distance normal to the stripline. This property is what makes striplines (and wires) poor NMR "coils", as it is impossible to provide a homogeneous magnetic field to a sample under these conditions. However, it has been shown by Kentgens, et al. that placing ground plates above and below the stripline detector at an optimal distance distorts the electromagnetic field produced by the wire into a region of homogeneous magnetic field above and below the stripline. Van Bentum et al., *J Magn Reson* 189 (1): 104-13 (2007). This configuration makes it possible to create the homogenous fields over small regions necessary to measure tiny quantities (nL) of scarce samples, which would be a challenge for the traditional NMR detection scheme.

The present system uses the stripline coil in a completely new way. The present inventors discovered, unexpectedly, that the so-called ground plates, which are necessary to maintain the homogeneous rf field in the sample region, do not need to be held at ground potential with respect to the NMR ground potential. Holding the plates at different potentials to one another does not affect the NMR data, provided sufficient electronic filtering is used for rf isolation. This leads to the idea of using the ground plates as battery or fuel cell electrodes.

An aspect of the invention is a battery comprising a stripline detector. The stripline detector can be incorporated into any type of battery, e.g., lithium-ion batteries, including without limitation lithium cobalt oxide (LiCoO$_2$), lithium iron phosphate (LiFePO$_4$), lithium manganese oxide (LiMn$_2$O$_4$; Li$_2$MnO$_3$), lithium nickel manganese cobalt oxide (LiNiMnCoO$_2$), lithium nickel cobalt aluminum oxide (LiNiCoAlO$_2$), lithium titanate (Li$_4$Ti$_5$O$_{12}$), and lithium sulfur batteries.

Referring to FIG. 1A, the stripline detector is cut from a thin (e.g., 35 micron thick) conductive metal (e.g., copper, aluminum, or gold) sheet and can be made in any physical dimensions appropriate for the battery or fuel cell under investigation. The narrowed neck section is of length l and width w. For optimum performance, l/w should be approximately 5.

In certain embodiments, the stripline detector is cut from a thin (e.g., 35 micron thick) graphene sheet and can be made in any physical dimensions appropriate for the battery or fuel cell under investigation. For optimum performance, l/w should be approximately 5.

In certain embodiments, the stripline can be a thin layer of a conducting metal, such as copper, aluminum, or gold, that is deposited onto a nonconductive substrate such as mica. For optimal performance, the metal will be constructed and arranged to have a narrow or narrowed section with l/w approximately 5.

In certain embodiments, the stripline can be a thin layer of graphene deposited on a nonconductive substrate such as mica. For optimal performance, the graphene will be constructed and arranged to have a narrow or narrowed section with l/w approximately 5.

In certain embodiments, the battery further comprises metallic cathode and anode support plates arranged in substantially parallel planes and situated on opposite sides of the stripline detector. The metallic support plates can take any 2-dimensional shape, including, for example, rectangular, square, circular, oval, and the like, provided that the two plates can cover, i.e., span, the full length (l) and width (w) of at least the neck or narrowed part of the stripline. In certain embodiments, the metallic support plates are annular in configuration, i.e., a central portion is absent. In certain embodiments, the metallic cathode and anode support plates are similar to each other in size and shape. In certain embodiments, the metallic cathode and anode support plates are substantially identical to each other in size and shape. In certain embodiments, the metallic cathode and anode support plates are substantially identical to each other in size and shape, and they are similarly disposed about the stripline, one over the other.

In certain embodiments, the metallic cathode and anode support plates are substantially identical annular rectangles, and they are similarly disposed about the stripline, one over the other.

In certain embodiments, the metallic cathode and anode support plates are substantially identical annular squares, and they are similarly disposed about the stripline, one over the other.

Figure 1B:
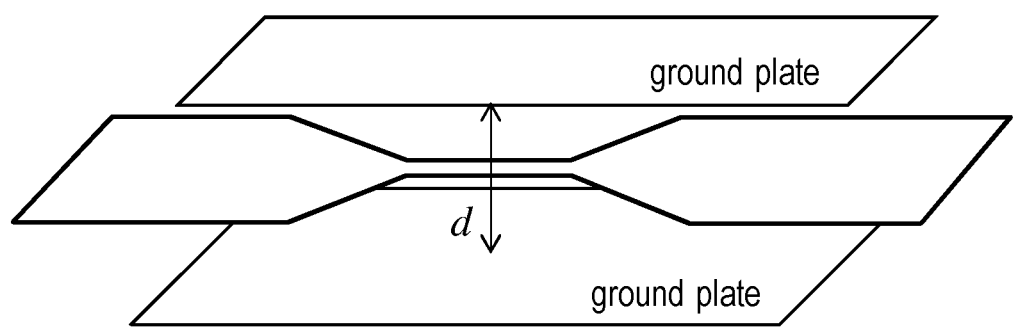
FIG. 1B is a schematic drawing depicting side view stripline detector geometry together with radiofrequency (rf) homogenizing ground plates. Dimension d represents the distance between the two plates. The sensitive region is above and below the narrow neck of the stripline detector.

Referring to FIG. 1B, the system of the invention incorporates the stripline detector inside a working battery or fuel cell, with the metallic cathode and anode support plates acting as the rf homogenizing plates. For optimum performance, w/d should be approximately 1.

In certain embodiments, the metallic cathode support plate comprises aluminum.

In certain embodiments, the metallic cathode support plate consists essentially of aluminum.

In certain embodiments, the metallic cathode support plate consists of aluminum.

In certain embodiments, the metallic anode support plate comprises copper.

In certain embodiments, the metallic anode support plate consists essentially of copper.

In certain embodiments, the metallic anode support plate consists of copper.

In certain embodiments, the metallic cathode support plate further comprises a cathode material deposited on the cathode support plate. The cathode material can be deposited on the cathode support plate using any suitable method.

In certain embodiments, the cathode material deposited on the cathode support plate is selected from the group consisting of lithium iron phosphate (LiFePO$_4$), lithium cobalt oxide (LiCoO$_2$), and spinel cathode materials.

In certain embodiments, the cathode material deposited on the cathode support plate comprises LiFePO$_4$.

In certain embodiments, the cathode material deposited on the cathode support plate consists essentially of LiFePO$_4$.

In certain embodiments, the cathode material deposited on the cathode support plate consists of LiFePO$_4$.

In certain embodiments, the cathode material deposited on the cathode support plate comprises LiCoO$_2$.

In certain embodiments, the cathode material deposited on the cathode support plate consists essentially of LiCoO$_2$.

In certain embodiments, the cathode material deposited on the cathode support plate consists of LiCoO$_2$.

In certain embodiments, the cathode material deposited on the cathode support plate comprises a spinel cathode material.

In certain embodiments, the cathode material deposited on the cathode support plate consists essentially of a spinel cathode material.

In certain embodiments, the cathode material deposited on the cathode support plate consists of a spinel cathode material.

Spinels are well known in the art, and nonlimiting examples of spinels include those of general formula LiM$_x$Mn$_{2-x}$O$_4$, wherein M represents metal ion. In certain embodiments, spinels include those of general formula LiNi$_x$Mn$_{2-x}$O$_4$, e.g., LiNi$_{0.5}$Mn$_{1.5}$O$_4$.

In accordance with each of the foregoing, in certain embodiments the metallic anode support plate further comprises an anode material deposited on the anode support plate. The anode material can be deposited on the anode support plate using any suitable method.

In certain embodiments, the anode material deposited on the anode support plate comprises graphite.

In certain embodiments, the anode material deposited on the anode support plate consists essentially of graphite.

In certain embodiments, the anode material deposited on the anode support plate consists of graphite.

The cathode and anode materials, as well as the electrolyte and all products and reactants of the battery chemistry, are thus in the sensitive region of the stripline detector (above the narrowed neck of length l. In this scheme, the electrodes, rather than being a hindrance to high-resolution NMR detection, are actually essential to the design by acting to homogenize the rf field in the detection region. Moreover, the presence of the stripline does not compromise or hinder the performance of the battery itself; the cathode and anode are designed so that much of their surface areas overlap the stripline neck, and thus significant ion transport is conducted through the electrolyte without encountering the stripline. This setup is therefore ideal for measuring in situ battery NMR, as high-resolution NMR data can be acquired quickly while the battery is cycled without disturbing the system in any way to effect the measurement.

Figure 2:
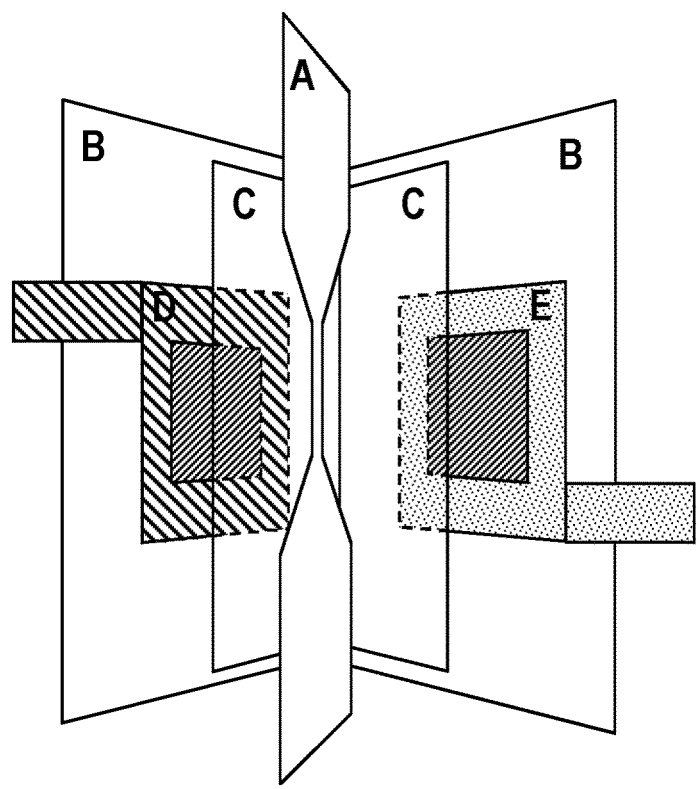
FIG. 2 is a schematic drawing depicting stripline battery assembly. A: stripline detector; B: aluminized battery pouch; C: separator material; D: copper plate acting as anode support and rf homogenizing plate; E: aluminum plate acting as cathode support and rf homogenizing plate. In the final assembly, the ends of the stripline detector and the tabs of the cathode and anode support plates protrude through the pouch seal for electrical connection.

Referring to FIG. 2, in accordance with each of the preceding embodiments, in certain embodiments the battery further comprises a first nonconductive separator situated between the stripline detector and the metallic cathode support plate, and a second nonconductive separator situated between the stripline detector and the metallic anode support plate, wherein the first nonconductive separator electrically isolates the stripline detector from the cathode, and the second nonconductive separator electrically isolates the stripline detector from the anode.

In certain embodiments, the first nonconductive separator comprises polyethylene.

In certain embodiments, the first nonconductive separator consists essentially of polyethylene.

In certain embodiments, the first nonconductive separator consists of polyethylene.

In certain embodiments, the first nonconductive separator comprises polypropylene.

In certain embodiments, the first nonconductive separator consists essentially of polypropylene.

In certain embodiments, the first nonconductive separator consists of polypropylene.

In certain embodiments, the first nonconductive separator comprises polytetrafluoroethylene (PTFE).

In certain embodiments, the first nonconductive separator consists essentially of PTFE.

In certain embodiments, the first nonconductive separator consists of PTFE.

In certain embodiments, the second nonconductive separator comprises polyethylene.

In certain embodiments, the second nonconductive separator consists essentially of polyethylene.

In certain embodiments, the second nonconductive separator consists of polyethylene.

In certain embodiments, the second nonconductive separator comprises polypropylene.

In certain embodiments, the second nonconductive separator consists essentially of polypropylene.

In certain embodiments, the second nonconductive separator consists of polypropylene.

In certain embodiments, the second nonconductive separator comprises PTFE.

In certain embodiments, the second nonconductive separator consists essentially of PTFE.

In certain embodiments, the second nonconductive separator consists of PTFE.

In certain embodiments, the first nonconductive separator and the second nonconductive separator are the same. For example, in certain embodiments, first nonconductive separator consists of polyethylene, and second nonconductive separator also consists of polyethylene. As another example, in certain embodiments, first nonconductive separator consists of polypropylene, and second nonconductive separator also consists of polypropylene. As yet another example, in certain embodiments, first nonconductive separator consists of PTFE, and second nonconductive separator also consists of PTFE.

In accordance with each of the foregoing embodiments, in certain embodiments, the first nonconductive separator and the second nonconductive separator are a single nonconductive separator. For example, the first nonconductive separator and the second nonconductive separator are constructed and arranged as a single sheet of material that may be folded over or otherwise reflected onto itself so as to cover or envelop the stripline detector, thereby electrically isolating the stripline detector from the cathode and the anode.

The in situ NMR battery is assembled as shown in FIG. 2. The cathode material is deposited on an aluminum substrate. The anode material is deposited on a copper substrate. These electrodes then act as the rf-homogenizing plates for the NMR as well as battery electrodes for the electrochemistry. A stripline inductor is fashioned from a 35 micrometer thick copper sheet with dimensions as shown in FIG. 1A. A separator material is placed on either side of the stripline to isolate it electrically from the cathode and anode. A flexible pouch cell is assembled in an inert atmosphere in a glovebox and partially sealed. In the glovebox, before the final edge is sealed, ~1 mL of electrolyte is added to the pouch, flooding the electrodes and wetting the separator. The copper stripline and battery electrode leads extend outside the sealed pouch for electrical connection; the seal is airtight around the metal protrusions. The battery is then cycled several times to ensure stability and charging capability.

Figure 3:
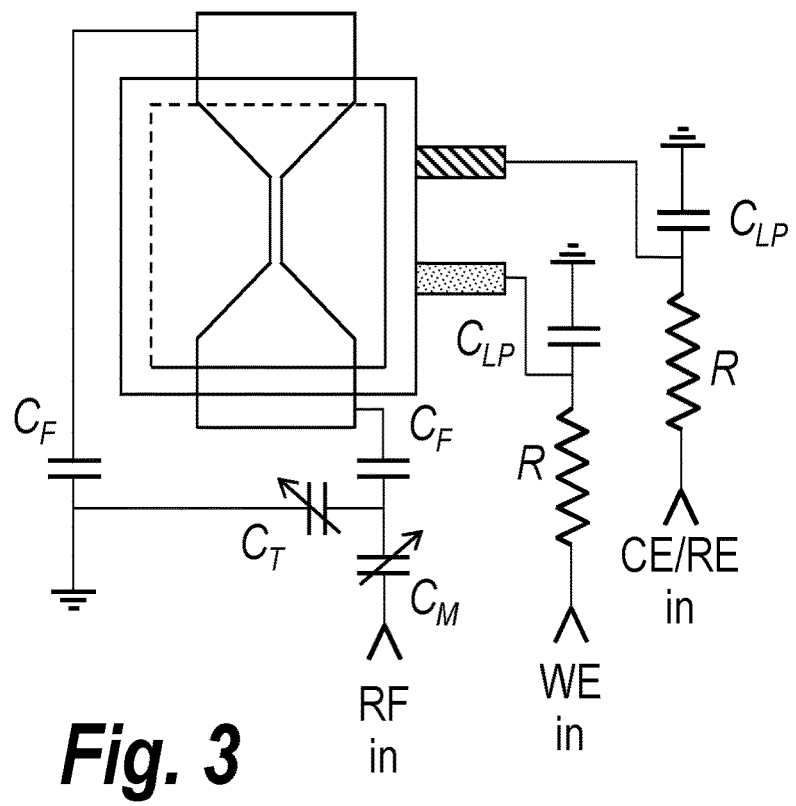
FIG. 3 is a circuit diagram depicting electrical connections to a stripline battery cell. $C_F$, filter capacitor; $C_{LP}$, low pass capacitor; $C_M$, variable impedance matching capacitor; $C_T$, tuning capacitor; R, resistor; RF, radio frequency pulse; WE, battery potentiastat working electrode.

FIG. 3 shows an electrical schematic for the in situ NMR probe. The battery electrode leads protruding from the side are isolated from the alternating current (ac) NMR circuitry by low pass filters consisting of a series combination of resistors R and capacitors $C_{LP}$. The battery potentiastat working electrode WE connects to the aluminum (cathode) plate. The potentiastat auxiliary and reference electrode leads connect to the copper (anode) plate. This effectively shunts to ground any ac currents induced in the electrode lines by the adjacent high power ac NMR circuitry, while allowing the passage of the direct current (dc) currents necessary for charging and discharging of the battery. The NMR circuit itself is a traditional parallel oscillating tank circuit with a variable tuning capacitor $C_T$ in parallel with the stripline detector. A variable impedance matching capacitor $C_M$ taps the rf pulse into the tank circuit. An additional two capacitors $C_F$ on the input and output of the stripline act as filters that pass the high frequency rf currents but effectively block any low frequency currents from the potentiastat that may couple into the NMR circuit. The stripline detector replaces the traditional solenoid inductor in this circuit.

An aspect of the invention is a fuel cell comprising a stripline detector. The stripline detector can be incorporated into any type of fuel cell.

Referring again to FIG. 1A, in certain embodiments, the stripline detector is cut from a thin (e.g., 35 micron thick) conductive metal (e.g., copper, aluminum, or gold) sheet and can be made in any physical dimensions appropriate for the fuel cell under investigation. For optimum performance, l/w should be approximately 5.

In certain embodiments, the stripline detector is cut from a thin (e.g., 35 micron thick) graphene sheet and can be made in any physical dimensions appropriate for the fuel cell under investigation. For optimum performance, l/w should be approximately 5.

In certain embodiments, the stripline can be a thin layer of a conducting metal, such as copper, aluminum, or gold, that is deposited onto a nonconductive substrate such as mica. For optimal performance, the metal will be constructed and arranged to have a narrow or narrowed section with l/w approximately 5.

In certain embodiments, the stripline can be a thin layer of graphene deposited on a nonconductive substrate such as mica. For optimal performance, the graphene will be constructed and arranged to have a narrow or narrowed section with l/w approximately 5.

In certain embodiments, the fuel cell further comprises metallic cathode and anode support plates arranged in substantially parallel planes and situated on opposite sides of the stripline detector. The metallic support plates can take any 2-dimensional shape, including, for example, rectangular, square, circular, oval, and the like, provided that the two plates can cover, i.e., span, the full length (l) and width (w) of at least the neck or narrowed part of the stripline. In certain embodiments, the metallic support plates are annular in configuration, i.e., a central portion is absent. In certain embodiments, the metallic cathode and anode support plates are similar to each other in size and shape. In certain embodiments, the metallic cathode and anode support plates are substantially identical to each other in size and shape. In certain embodiments, the metallic cathode and anode support plates are substantially identical to each other in size and shape, and they are similarly disposed about the stripline and one over the other.

In certain embodiments, the metallic cathode and anode support plates are substantially identical annular rectangles, and they are similarly disposed about the stripline and one over the other.

In certain embodiments, the metallic cathode and anode support plates are substantially identical annular squares, and they are similarly disposed about the stripline and one over the other.

Referring again to FIG. 1B, the system of the invention incorporates the stripline detector inside a working fuel cell, with the metallic cathode and anode support plates acting as the rf homogenizing plates. For optimum performance, w/d should be approximately 1.

In certain embodiments, the metallic cathode support plate comprises aluminum.

In certain embodiments, the metallic cathode support plate consists essentially of aluminum.

In certain embodiments, the metallic cathode support plate consists of aluminum.

In certain embodiments, the metallic anode support plate comprises copper.

In certain embodiments, the metallic anode support plate consists essentially of copper.

In certain embodiments, the metallic anode support plate consists of copper.

In certain embodiments, the metallic cathode support plate further comprises a cathode material deposited on the cathode support plate. The cathode material can be deposited on the cathode support plate using any suitable method.

In certain embodiments, the cathode material deposited on the cathode support plate is selected from the group consisting of lithium iron phosphate ($LiFePO_4$), lithium cobalt oxide ($LiCoO_2$), and spinel cathode materials.

In certain embodiments, the cathode material deposited on the cathode support plate comprises $LiFePO_4$.

In certain embodiments, the cathode material deposited on the cathode support plate consists essentially of $LiFePO_4$.

In certain embodiments, the cathode material deposited on the cathode support plate consists of $LiFePO_4$.

In certain embodiments, the cathode material deposited on the cathode support plate comprises $LiCoO_2$.

In certain embodiments, the cathode material deposited on the cathode support plate consists essentially of $LiCoO_2$.

In certain embodiments, the cathode material deposited on the cathode support plate consists of $LiCoO_2$.

In certain embodiments, the cathode material deposited on the cathode support plate comprises a spinel cathode material.

In certain embodiments, the cathode material deposited on the cathode support plate consists essentially of a spinel cathode material.

In certain embodiments, the cathode material deposited on the cathode support plate consists of a spinel cathode material.

Spinels are well known in the art, and nonlimiting examples of spinels include $LiNi_xMn_{2-x}O_4$, e.g., $LiNi_{0.5}Mn_{1.5}O_4$.

In accordance with each of the foregoing, in certain embodiments the metallic anode support plate further comprises an anode material deposited on the anode support plate. The anode material can be deposited on the anode support plate using any suitable method.

In certain embodiments, the anode material deposited on the anode support plate comprises graphite.

In certain embodiments, the anode material deposited on the anode support plate consists essentially of graphite.

In certain embodiments, the anode material deposited on the anode support plate consists of graphite.

The cathode and anode materials, as well as the electrolyte and all products and reactants of the fuel cell chemistry, are thus in the sensitive region of the stripline detector (above the narrowed neck "l". In this scheme, the electrodes, rather than being a hindrance to high-resolution NMR detection, are actually essential to the design by acting to homogenize the rf field in the detection region. Moreover, the presence of the stripline does not compromise or hinder the performance of the fuel cell itself; the cathode and anode are designed so that much of their surface areas overlap the stripline neck, and thus significant ion transport is conducted through the electrolyte without encountering the stripline. This setup is therefore ideal for measuring in situ fuel cell NMR, as high-resolution NMR data can be acquired quickly while the fuel cell is cycled without disturbing the system in any way to effect the measurement.

Referring again to FIG. 2, in accordance with each of the preceding embodiments, in certain embodiments the fuel cell further comprises a first nonconductive separator situated between the stripline detector and the metallic cathode support plate, and a second nonconductive separator situated between the stripline detector and the metallic anode support plate, wherein the first nonconductive separator electrically isolates the stripline detector from the cathode, and the second nonconductive separator electrically isolates the stripline detector from the anode.

In certain embodiments, the first nonconductive separator comprises polyethylene.

In certain embodiments, the first nonconductive separator consists essentially of polyethylene.

In certain embodiments, the first nonconductive separator consists of polyethylene.

In certain embodiments, the first nonconductive separator comprises polypropylene.

In certain embodiments, the first nonconductive separator consists essentially of polypropylene.

In certain embodiments, the first nonconductive separator consists of polypropylene.

In certain embodiments, the first nonconductive separator comprises PTFE.

In certain embodiments, the first nonconductive separator consists essentially of PTFE.

In certain embodiments, the first nonconductive separator consists of PTFE.

In certain embodiments, the second nonconductive separator comprises polyethylene.

In certain embodiments, the second nonconductive separator consists essentially of polyethylene.

In certain embodiments, the second nonconductive separator consists of polyethylene.

In certain embodiments, the second nonconductive separator comprises polypropylene.

In certain embodiments, the second nonconductive separator consists essentially of polypropylene.

In certain embodiments, the second nonconductive separator consists of polypropylene.

In certain embodiments, the second nonconductive separator comprises PTFE.

In certain embodiments, the second nonconductive separator consists essentially of PTFE.

In certain embodiments, the second nonconductive separator consists of PTFE.

In certain embodiments, the first nonconductive separator and the second nonconductive separator are the same. For example, in certain embodiments, first nonconductive separator consists of polyethylene, and second nonconductive separator also consists of polyethylene. As another example, in certain embodiments, first nonconductive separator consists of polypropylene, and second nonconductive separator also consists of polypropylene. As yet another example, in certain embodiments, first nonconductive separator consists of PTFE, and second nonconductive separator also consists of PTFE.

In accordance with each of the foregoing embodiments, in certain embodiments, the first nonconductive separator and the second nonconductive separator are a single nonconductive separator. For example, the first nonconductive separator and the second nonconductive separator are constructed and arranged as a single sheet of material that may be folded over or otherwise reflected onto itself so as to cover or envelop the stripline detector, thereby electrically isolating the stripline detector from the cathode and the anode.

The in situ NMR fuel cell is assembled as shown in FIG. 2. The cathode material is deposited on an aluminum substrate. The anode material is deposited on a copper substrate. These electrodes then act as the rf-homogenizing plates for the NMR as well as fuel cell electrodes for the electrochemistry. A stripline inductor is fashioned from a 35 micrometer thick copper sheet with dimensions as shown in FIG. 1A. A separator material is placed on either side of the stripline to isolate it electrically from the cathode and anode. A flexible pouch cell is assembled in an inert atmosphere in a glovebox and partially sealed. In the glovebox, before the final edge is sealed, ~1 mL of electrolyte is added to the pouch, flooding the electrodes and wetting the separator. The copper stripline and fuel cell electrode leads extend outside the sealed pouch for electrical connection; the seal is airtight around the metal protrusions. The fuel cell is then cycled several times to ensure stability and charging capability.

An aspect of the invention is a method for measuring in situ battery nuclear magnetic resonance (NMR), comprising
providing a battery of the invention;
connecting the stripline detector to an NMR circuit;
isolating electrode leads of the battery from alternating current NMR circuitry; and
cycling the battery while acquiring NMR data from the battery.

For example, in an embodiment, the method comprises:
providing an apparatus having (i) a magnetic field generating apparatus located in a cryostat and surrounding a bore defining an NMR working region; (ii) a system for performing an NMR process on a battery of the invention in the NMR working region; and (iii) optionally a battery positioning mechanism which can be inserted into the bore to bring the battery into the NMR working region, the magnetic field generating apparatus being suitably structured so that the magnetic field in the NMR working region has a homogeneity or profile suitable for performing an NMR process on the battery, wherein the magnetic field generating apparatus comprises a magnet assembly located in the cryostat and surrounding the NMR working area bore so as to define the NMR working region in the bore, wherein the magnet assembly is suitably shielded so that the magnetic field in the NMR working region has a homogeneity or profile suitable for performing an NMR measurement on the battery;
preparing the battery for the NMR process;
optionally using the battery positioning mechanism to insert the battery into the NMR working region; and
performing an NMR measurement on the battery.

An aspect of the invention is a method for measuring in situ fuel cell nuclear magnetic resonance (NMR), comprising
providing a fuel cell of the invention;
connecting the stripline detector to an NMR circuit;
isolating electrode leads of the fuel cell from alternating current NMR circuitry; and
cycling the fuel cell while acquiring NMR data from the fuel cell.

For example, in an embodiment, the method comprises:
providing an apparatus having (i) a magnetic field generating apparatus located in a cryostat and surrounding a bore defining an NMR working region; (ii) a system for performing an NMR process on a fuel cell of the invention in the NMR working region; and (iii) optionally a fuel cell positioning mechanism which can be inserted into the bore to bring the fuel cell into the NMR working region, the magnetic field generating apparatus being suitably structured so that the magnetic field in the NMR working region has a homogeneity or profile suitable for performing an NMR process on the fuel cell, wherein the magnetic field generating apparatus comprises a magnet assembly located in the cryostat and surrounding the NMR working area bore so as to define the NMR working region in the bore, wherein the magnet assembly is suitably shielded so that the magnetic field in the NMR working region has a homogeneity or profile suitable for performing an NMR measurement on the fuel cell;
preparing the fuel cell for the NMR process;
optionally using the fuel cell positioning mechanism to insert the fuel cell into the NMR working region; and
performing an NMR measurement on the fuel cell.

EXAMPLES

Example 1

In Situ NMR of Li-ion Battery

Figure 4:
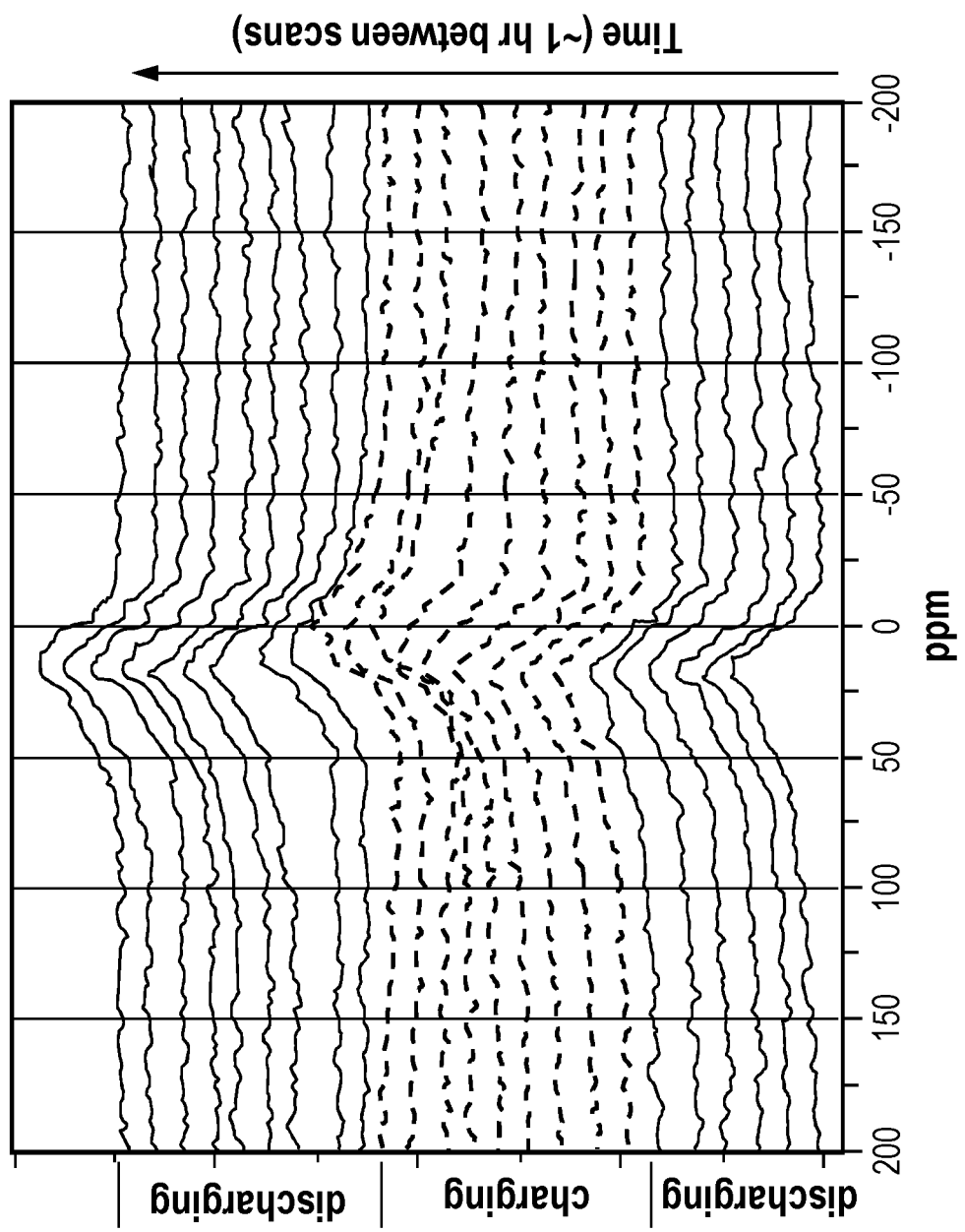
FIG. 4 is a graph depicting $^7$Li in situ NMR spectra for a lithium iron phosphate (LiFePO$_4$) vs. graphite pouch cell with stripline operating with 0.1 mA charge/discharge current.

A lithium-ion battery with an incorporated stripline detector was constructed. Lithium iron phosphate was used as the cathode material and graphite as the anode material. Lithium iron phosphate $LiFePO_4$ (LFP) is common cathode material in lithium iron phosphate batteries. It has a higher power density than the more common lithium cobalt oxide $LiCoO_2$ cathode material and a fairly constant discharge voltage at 3.2 V. Using a charge/discharge current of 0.1 mA, the battery was cycled at 0.1° C. over the course of 10 hours. During the charge and discharge process, $^7Li$ NMR was acquired to measure the chemical shift (and thus the molecular environment) of the Li ions in the battery. Representative resulting spectra are shown in FIG. 4.

Figure 5:
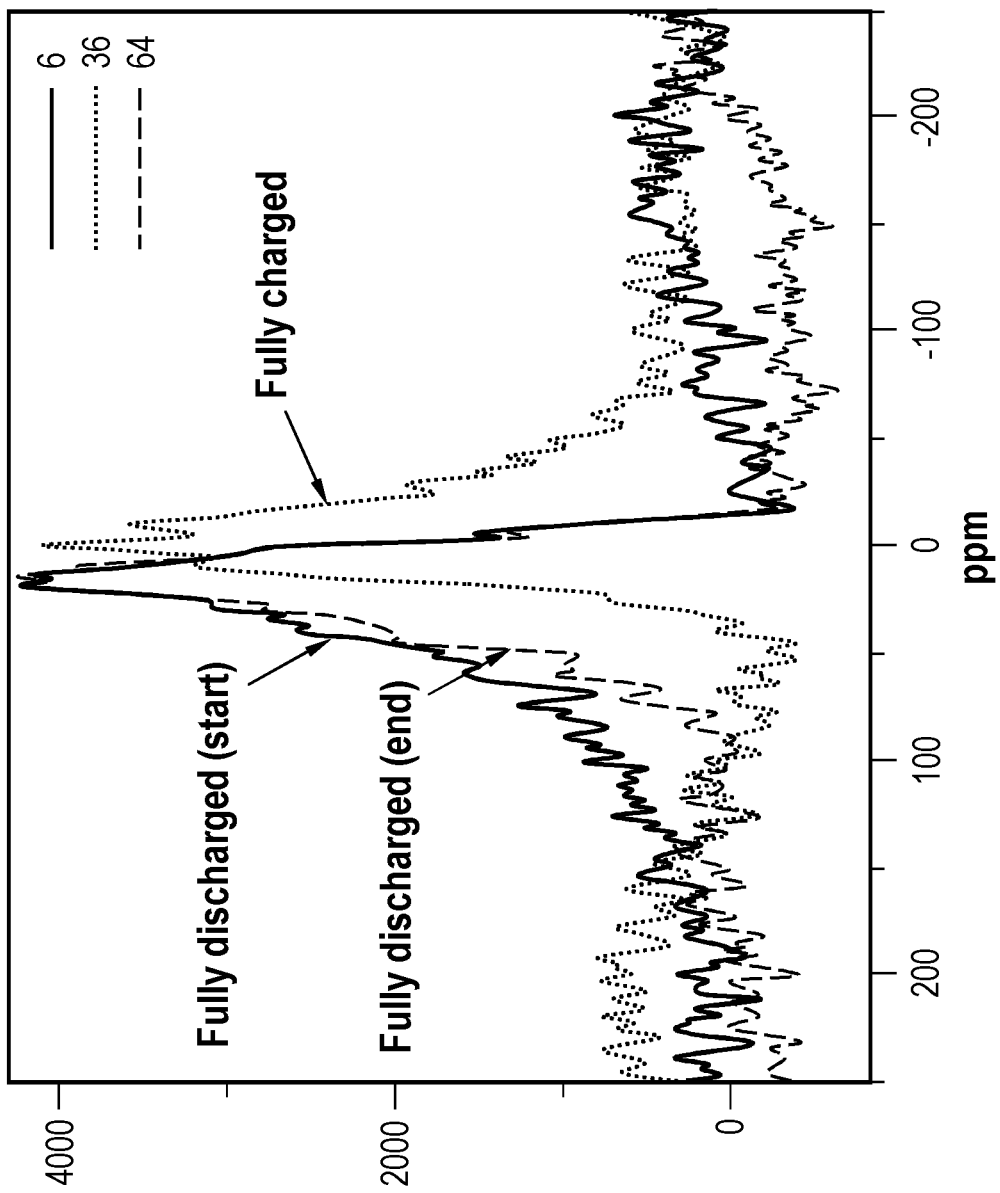
FIG. 5 is a graph depicting $^7$Li in situ NMR spectra for a lithium iron phosphate (LiFePO$_4$) vs. graphite pouch cell with stripline. Depicted are fully charged peak (red dotted trace), initial fully discharged peak (black solid trace), and final fully discharged peak (blue solid trace).

During discharge, the $^7Li$ resonance appeared with a chemical shift of $\delta=+13$ ppm with respect to a LiCl standard. During the charging cycle, the resonance shifted to higher field, finally reaching $\delta=-2$ ppm during full charge. Upon discharge, the resonance shifted back to the $\delta=+13$ ppm position. Data were acquired for many cycles, with the shifts being consistent and repeatable. The fully charged peak is compared with the initial and final fully discharged peaks in FIG. 5.

These data show that the stripline battery detector can easily distinguish between the molecular environments of the lithium ions in the charged state ($Li^+$ embedded in the graphite) and the discharged state ($Li^+$ incorporated in the cathode). In the case of LiFePO$_4$ as the cathode material as in the above experiments, the presence of paramagnetic Fe in the sample causes the Li resonance to broaden significantly. Nonetheless, the changes in chemical environment are still easily distinguishable. Using other cathode materials such as lithium cobalt oxide or one of the many spinel cathode materials should yield even sharper resonances that can distinguish between even smaller chemical shifts.

We claim:

1. A battery comprising a stripline detector for in situ NMR inside the battery, comprising metallic cathode and anode support plates arranged in parallel planes and situated on opposite sides of the stripline detector.

2. The battery of claim 1, wherein the metallic cathode support plate comprises aluminum.

3. The battery of claim 1, wherein the metallic cathode support plate further comprises a cathode material deposited on the cathode support plate.

4. The battery of claim 3, wherein the cathode material deposited on the cathode support plate is selected from the group consisting of lithium iron phosphate (LiFePO$_4$), lithium cobalt oxide (LiCoO$_2$), and spinel cathode materials.

5. The battery of claim 1, wherein the metallic anode support plate comprises copper.

6. The battery of claim 5, wherein the metallic anode support plate further comprises an anode material deposited on the anode support plate.

7. The battery of claim 6, wherein the anode material deposited on the anode support plate is graphite.

8. The battery of claim 1, further comprising a first nonconductive separator situated between the stripline detector and the metallic cathode support plate, and a second nonconductive separator situated between the stripline detector and the metallic anode support plate, wherein the first nonconductive separator electrically isolates the stripline detector from the cathode, and the second nonconductive separator electrically isolates the stripline detector from the anode.

9. The battery of claim 8, wherein the first nonconductive separator and the second nonconductive separator independently comprise a material selected from the group consisting of polyethylene, polypropylene, and polytetrafluoroethylene (PTFE).

10. The battery of claim 8, wherein the first nonconductive separator and the second nonconductive separator are comprised of the same material.

11. The battery of claim 8, wherein the first nonconductive separator and the second nonconductive separator are a single nonconductive separator.

12. A method for measuring in situ battery nuclear magnetic resonance (NMR), comprising
providing the battery of claim 1;
connecting the stripline detector to an NMR circuit;
isolating electrode leads of the battery from alternating current NMR circuitry; and
cycling the battery while acquiring NMR data from the battery.

* * * * *